United States Patent [19]

Lebby et al.

[11] Patent Number: 5,359,618
[45] Date of Patent: Oct. 25, 1994

[54] HIGH EFFICIENCY VCSEL AND METHOD OF FABRICATION

[75] Inventors: Michael S. Lebby, Apache Junction; Chan-Long Shieh, Paradise Valley, both of Ariz.; Hsing-Chung Lee, Calabasas, Calif.

[73] Assignee: Motorola, Inc., Schaumburg, Ill.

[21] Appl. No.: 69,812

[22] Filed: Jun. 1, 1993

[51] Int. Cl.⁵ .................................. H01S 3/19
[52] U.S. Cl. .................................. 372/45; 372/46; 372/96; 372/99; 437/129
[58] Field of Search .............. 372/96, 46, 45, 99; 437/129

[56] References Cited

U.S. PATENT DOCUMENTS

| | | | |
|---|---|---|---|
| 4,873,696 | 10/1989 | Coldren et al. | 372/96 |
| 4,943,970 | 7/1990 | Bradley | 372/46 |
| 5,245,622 | 9/1993 | Jewell et al. | 372/96 |

Primary Examiner—Georgia Y. Epps
Attorney, Agent, or Firm—Eugene A. Parsons

[57] ABSTRACT

A high efficiency vertical cavity surface emitting laser with first and second mirror stacks and an active area sandwiched therebetween. The second mirror stack is formed into a mesa with exposed end surface and outer sidewalls and a centrally located light emission region. A portion of the mesa adjacent the exposed outer sidewalls has a reduced electrical conductance so as to spread operating current from the outer sidewalls into the centrally located light emission region. The electrical conductance of the portion is reduced by oxidizing or etching the outer sidewalls.

14 Claims, 2 Drawing Sheets

HIGH EFFICIENCY VCSEL AND METHOD OF FABRICATION

FIELD OF THE INVENTION

The present invention pertains to vertical cavity surface emitting lasers and more specifically to vertical cavity surface emitting lasers with a mesa structure and a light emission window on the surface of the mesa.

BACKGROUND OF THE INVENTION

Vertical cavity surface emitting lasers, which have become quite well known in the past few years, are formed in a variety of configurations. However, the basis for the laser in virtually all configurations is an active area sandwiched between two mirror stacks. To activate the laser it is necessary to drive current through the mirror stacks and the active area. This is generally accomplished by placing a first electrode across the mirror stack at one end of the laser and a second electrode across the mirror stack at the other end of the laser. One of the electrodes generally defines a central opening therethrough for the emission of light.

For maximum efficiency, it is necessary that the major portion of the current is coextensive with the lasing, or light emission area. Any current outside the lasing area is either wasted or produces lasing which is wasted. Further, the central opening through one of the electrodes should be very close to the same size as the lasing area, otherwise some of the light produced within the laser will not be able to exit the laser but will simply be reflected back into the laser and dispersed. Thus, there is a need to coordinate the application of current to the laser with the lasing area and the emission output.

SUMMARY OF THE INVENTION

It is a purpose of the present invention to provide a new and improved high efficiency vertical cavity surface emitting laser.

It is a further purpose of the present invention to provide a new and improved high efficiency vertical cavity surface emitting laser wherein the current path and lasing area are more closely coordinated.

It is a still further purpose of the present invention to provide a new and improved high efficiency vertical cavity surface emitting laser wherein the current path and lasing area are more closely coordinated and are also more closely coordinated with the emission window.

It is a yet another purpose of the present invention to provide a new and improved method of fabricating a high efficiency vertical cavity surface emitting laser.

The above described problems and others are at least partially solved and the above purposes and others are realized in a method of fabricating a high efficiency vertical cavity surface emitting laser including the steps of forming first and second mirror stacks with an active area sandwiched therebetween, forming the second mirror stack into a mesa with exposed end surface and outer sidewalls and a centrally located light emission region, reducing the electrical conductance of a portion of the mesa adjacent the exposed outer sidewalls to channel operating current from the outer sidewalls into the centrally located light emission region, and forming an electrical contact at least on the end surface of the mesa in overlying relationship to the portion of the mesa with reduced electrical conductance.

The above described problems and others are at least partially solved and the above purposes and others are further realized in a high efficiency vertical cavity surface emitting laser including first and second mirror stacks with an active area sandwiched therebetween. The second mirror stack is formed into a mesa with exposed end surface and outer sidewalls and a centrally located light emission region. A portion of the mesa adjacent the exposed outer sidewalls has a reduced electrical conductance so as to channel operating current from the outer sidewalls into the centrally located light emission region, and an electrical contact is formed at least on the end surface of the mesa in overlying relationship to the portion of the mesa with reduced electrical conductance.

BRIEF DESCRIPTION OF THE DRAWINGS

Referring to the drawings.

DESCRIPTION OF THE PREFERRED EMBODIMENTS

Figure 1:
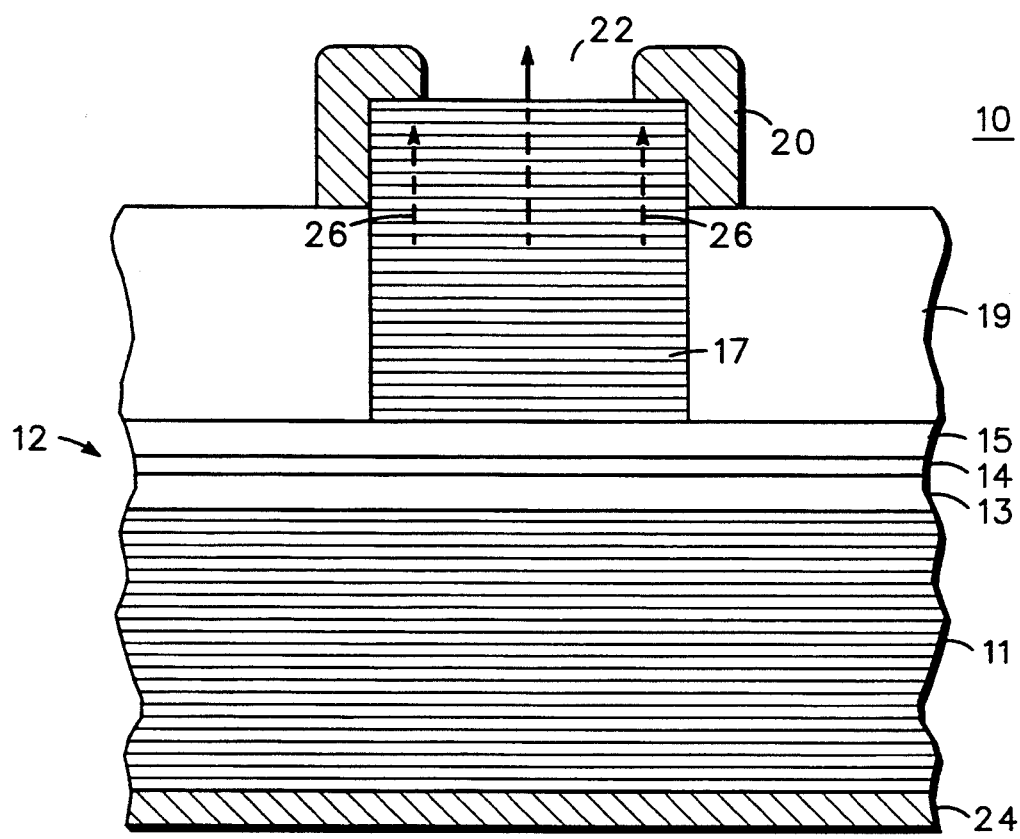
FIG. 1 is a partial sectional view of a vertical cavity surface emitting laser with electrodes overlapping the emission area.

Referring to FIG. 1, a vertical cavity surface emitting laser 10 is illustrated. Laser 10 includes a first stack of mirrors 11, an active area 12 having a first cladding layer 13, an active layer 14 (such as quantum wells and the like) and a second cladding layer 15, and a second stack of mirrors 17. Second stack of mirrors 17 is etched, or selectively deposited, to form a mesa-like structure. In general, the size (diameter) of second stack of mirrors 17 is dependent upon the mode of operation of laser 10. A protective and insulative layer 19 of material, such as a nitride, is formed over the sidewalls of second mirror stack 17 and an electrical contact 20 is formed in contact with at least the upper end of second mirror stack 17. Electrical contact 20 defines a window 22 for the emission of light from laser 10 through the upper surface of second mirror stack 17. A second electrical contact 24 is positioned over the lower surface of first mirror stack 11. It should be understood that in some embodiments the second electrical contact may be placed at the top of first stack of mirrors 11, so the external contact can be accessed from the same side as electrical contact 20.

An operating voltage applied across electrical contacts 20 and 24 produces a current flow in laser 10 which produces the lasing action. In general, because of the position of electrical contact 20 on the surface of second mirror stack 17, current flows throughout the mesa-like structure of second mirror stack 17 and lasing is supported where ever current flows. The problem is that light generated under electrical contact 20 (represented by broken arrows 26), adjacent the edged of the mesa-like structure, is trapped and can not exit laser 10 through emission window 22. Therefore, light generated beneath electrical contact 20 is wasted and detracts from the operating efficiency of laser 10.

Figure 2:
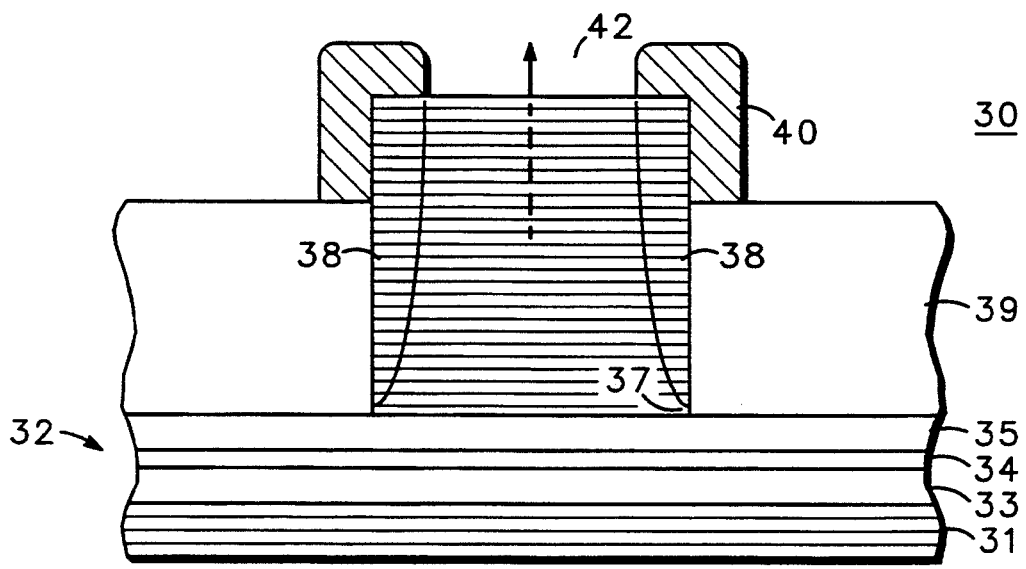
FIG. 2 is a sectional view of a vertical cavity surface emitting laser incorporating the present invention.

Referring to FIG. 2, a vertical cavity surface emitting laser 30 embodying the present invention is illustrated. Laser 30 includes a first stack of mirrors 31, an active area 32 having a first cladding area 33, an active area 34 and a second cladding layer 35, and a second stack of mirrors 37. Second stack of mirrors 37 is etched, or selectively deposited, to form a mesa-like structure, as described above. To reduce or eliminate the problem of wasted light described above, the electrical conductance of a portion 38 of second stack of mirrors 37 is reduced.

Figure 3:
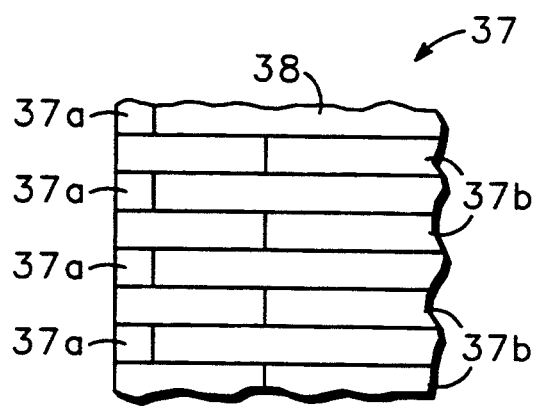
FIG. 3 is a sectional view of another vertical cavity surface emitting laser embodying the present invention.

Portion 38 is adjacent the exterior side wall surface of the mesa-like structure. Second stack of mirrors 37 is formed dominantly of alternating low and high aluminum containing layers 37a and 37b of AlGaAs ($Al_{0.15}Ga_{0.85}As$ and $Al_{0.85}Ga0.15As$, respectively) distributed Bragg reflectors. Alternating layers 37a and 37b provide alternating high and low indexes of refraction. In this specific embodiment, alternate layers 37a and 37b of low and high aluminum containing AlGaAs are selectively oxidized in accordance with the aluminum content, as illustrated in FIG. 3, to cause portion 38 of the mesa-like structure to provide a high resistance region adjacent the exterior side wall of second stack of mirrors 37. Layers 37b with the higher aluminum content oxidize more readily, as illustrated by the different amounts of oxidation in alternate layers 37a and 37b of second stack of mirrors 38 in FIG. 3. The oxidation in this embodiment is accomplished by subjecting the exterior side walls of the mesa-like structure to a nitrogen ambient containing water moisture. In this ambient the natural oxidation of the aluminum causes a high resistance region within second stack of mirrors 37. Specifically, the process parameters are 400 degrees Centigrade, regular flow using a carrying gas like nitrogen with added water moisture.

Figure 4:
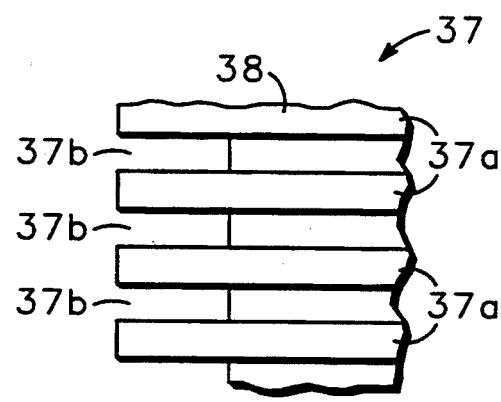
FIG. 4 is a greatly enlarged view of a portion of a laser, illustrating a method of fabrication.

In a second embodiment high aluminum content AlGaAs layers 37b of second stack of mirrors 37 are undercut, or etched to reduce the electrical conductivity of portion 38. In this specific embodiment, selective wet etching is performed by using dilute HF in a range of 1:50 to 1:200 and preferably approximately 1:120, with DI water to selectively etch the high aluminum containing AlGaAs, as illustrated in FIG. 4. Typical etch times are about 2 minutes. This process produces voids in the high aluminum content AlGaAs alternate layers 37b, which are ultimately sealed, as will be apparent presently. The voids in the edge of second stack of mirrors 37 substantially reduces the electrical conductance of portion 38 of second stack of mirrors 37.

An insulative and protective layer 39 is formed on the exterior side walls of second stack of mirrors 37 over the oxidized or selectively etched portion 38. An electrical contact 40 is formed on at least a portion of the end wall of second stack of mirrors 37 in overlying relationship to the oxidized or selectively etched portion 38. A light emission window 42 is defined in electrical contact 40. In this embodiment the high resistance area, portion 38, forces electrical current toward the center of the mesa-like area. Since no current flows in the high resistance area, portion 38, below electrical contact 40, no lasing occurs in this area and no light is generated.

Figure 5:
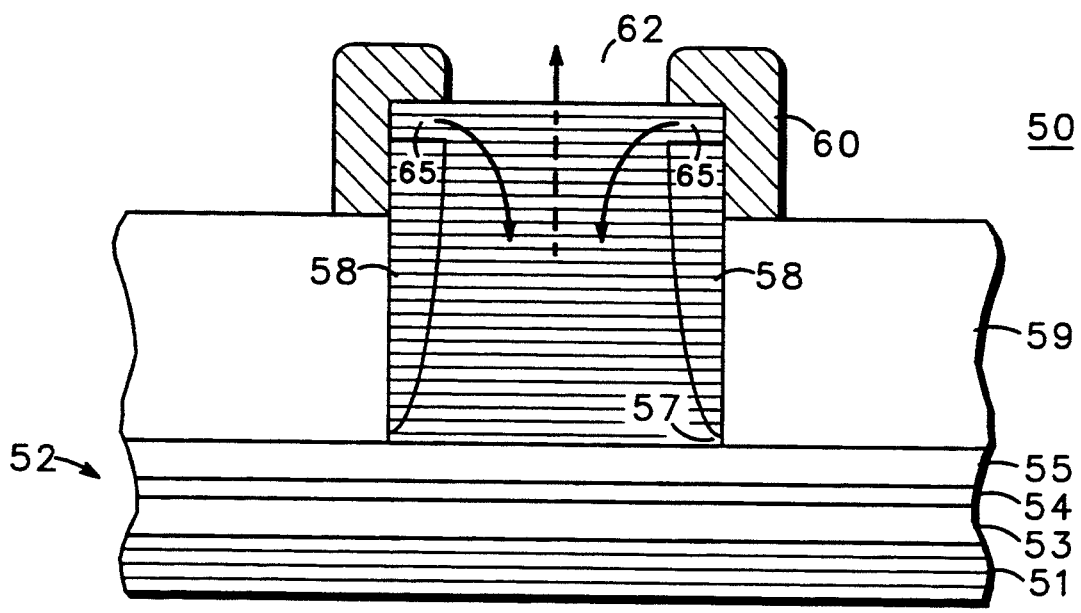
FIG. 5 is a greatly enlarged view of a portion of a laser, illustrating another method of fabrication.

Referring specifically to FIG. 5, another embodiment of a vertical cavity surface emitting laser 50 is illustrated. Laser 50 includes a first stack of mirrors 51, an active area 52 having a first cladding area 53, an active area 54 and a second cladding layer 55, and a second stack of mirrors 57. The exterior side walls of second stack of mirrors 57 are oxidized or selectively etched in a portion 58 to reduce the electrical conductivity, as described above. An insulative and protective layer 59 is formed on the exterior side walls of second stack of mirrors 57 over the oxidized or selectively etched portion 58. An electrical contact 60 is formed on at least a portion of the end wall of second stack of mirrors 57 in overlying relationship to the oxidized or selectively etched portion 58. A light emission window 62 is defined in electrical contact 60.

In this specific embodiment, an upper end of portion 58 is spaced downwardly from the upper surface of second stack of mirrors 57 to provide a space 65. Space 65 is highly doped, relative to second stack of mirrors 57, to allow current to flow easily from electrical contact 60 into the lasing (central) portion of second stack of mirrors 57. In this specific embodiment, a top layer of AlGaAs, which is approximately 100 Å thick, is doped with $10^{19}$ doping. A second layer of AlGaAs, immediately beneath the first layer, which is approximately 2000 Å thick, is doped with $10^{19}$ doping. Highly doped space 65 provides a low resistance path for electrical current to flow from electrical contact 60 to the central lasing portion of second stack of mirrors 57. Simultaneously, high resistance portion 58 directs the current into the central lasing portion and prevents current flow and subsequent lasing in portion 58, directly below electrical contact 60.

Thus, current is not wasted in portion 58 and no lasing occurs in this portion. Since no wasted light is generated and no current is wasted generating trapped light, the laser operates more efficiently and all current is used to generate useful light. The structures described and illustrated are relatively simple to manufacture since no additional masking steps are required.

While we have shown and described specific embodiments of the present invention, further modifications and improvements will occur to those skilled in the art. We desire it to be understood, therefore, that this invention is not limited to the particular forms shown and we intend in the append claims to cover all modifications that do not depart from the spirit and scope of this invention.

What is claimed is:

1. A method of fabricating a high efficiency vertical cavity surface emitting laser comprising the steps of:
    forming first and second mirror stacks with an active area sandwiched therebetween;
    forming the second mirror stack into a mesa with exposed end surface and outer sidewalls and a centrally located light emission region;
    reducing the electrical conductance of a portion of the second mirror stack adjacent the exposed outer sidewalls to channel operating current from the outer sidewalls into the centrally located light emission region; and
    forming an electrical contact at least on the end surface of the mesa in overlying relationship to the portion of the second mirror stack with reduced electrical conductance.

2. A method of fabricating a high efficiency vertical cavity surface emitting laser as claimed in claim 1 wherein the step of reducing the electrical conductance of a portion of the second mirror stack includes oxidizing selected layers of the second mirror stack adjacent the outer sidewalls.

3. A method of fabricating a high efficiency vertical cavity surface emitting laser as claimed in claim 2 wherein the step of forming the second mirror stack includes depositing alternate layers of high and low aluminum content AlGaAs in at least a portion of the second mirror stack and the step of oxidizing selected layers includes oxidizing at least the high aluminum content AlGaAs layers.

4. A method of fabricating a high efficiency vertical cavity surface emitting laser as claimed in claim 3 wherein the step of oxidizing the high aluminum content AlGaAs layers includes flowing nitrogen gas with added water moisture over the outer sidewalls at a temperature of approximately 400 degrees centigrade.

5. A method of fabricating a high efficiency vertical cavity surface emitting laser as claimed in claim 1 wherein the step of reducing the electrical conductance of a portion of the second mirror stack includes etching selected layers of the second mirror stack adjacent the outer sidewalls.

6. A method of fabricating a high efficiency vertical cavity surface emitting laser as claimed in claim 5 wherein the step of forming the second mirror stack includes depositing alternate layers of high and low aluminum content AlGaAs in at least a portion of the second mirror stack and the step of etching selected layers includes etching at least the high aluminum content AlGaAs layers.

7. A method of fabricating a high efficiency vertical cavity surface emitting laser as claimed in claim 6 wherein the step of etching the high aluminum content AlGaAs layers includes wet etching with dilute HF with DI water.

8. A method of fabricating a high efficiency vertical cavity surface emitting laser as claimed in claim 1 including in addition the step of increasing the conductance of a portion of the second mirror stack adjacent the end surface and between the portion of the second mirror stack with reduced electrical conductance and the electrical contact.

9. A method of fabricating a high efficiency vertical cavity surface emitting laser as claimed in claim 8 wherein the step of increasing the conductance of a portion of the second mirror stack includes relatively highly doping the portion.

10. A high efficiency vertical cavity surface emitting laser comprising:
first and second mirror stacks with an active area sandwiched therebetween;
the second mirror stack being formed into a mesa with exposed end surface and outer sidewalls and a centrally located light emission region;
a portion of the second mirror stack adjacent the exposed outer sidewalls having a reduced electrical conductance so as to channel operating current from the outer sidewalls into the centrally located light emission region; and
an electrical contact at least on the end surface of the mesa in overlying relationship to the portion of the second mirror stack with reduced electrical conductance.

11. A high efficiency vertical cavity surface emitting laser as claimed in claim 10 wherein the second mirror stack includes alternating layers of high and low aluminum content AlGaAs and the portion with reduced electrical conductance includes portions of the high aluminum content AlGaAs layers which are oxidized.

12. A high efficiency vertical cavity surface emitting laser as claimed in claim 10 wherein the second mirror stack includes alternating layers of high and low aluminum content AlGaAs and the portion with reduced electrical conductance includes removed portions of the high aluminum content AlGaAs layers.

13. A high efficiency vertical cavity surface emitting laser as claimed in claim 10 including in addition a portion of the second mirror stack, adjacent the end surface and between the portion of the second mirror stack with reduced electrical conductance and the electrical contact, having a relatively increased conductance.

14. A high efficiency vertical cavity surface emitting laser as claimed in claim 13 wherein the portion of the second mirror stack having a relatively increased conductance includes a first layer of AlGaAs, adjacent the end surface, at least 100 Å thick with at least a $10^{19}$ doping and a second layer of AlGaAs, adjacent the first layer, at least 2000 Å thick and with at least $10^{19}$ doping.

* * * * *